(12) United States Patent
Cathelin et al.

(10) Patent No.: US 7,593,700 B2
(45) Date of Patent: Sep. 22, 2009

(54) CONTROLLABLE RADIO FREQUENCY STAGE WITH VARIABLE GAIN/ATTENUATION, IN PARTICULAR INCORPORATED INTO THE TRANSMISSION CHAIN OF A CELLULAR MOBILE TELEPHONE, AND CORRESPONDING CONTROL METHOD

(75) Inventors: Philippe Cathelin, Laval (FR); Jean-Charles Grasset, Moirans (FR)

(73) Assignee: STMicroelectronics SA, Montrouge (FR)

( * ) Notice: Subject to any disclaimer, the term of this patent is extended or adjusted under 35 U.S.C. 154(b) by 471 days.

(21) Appl. No.: 11/550,871

(22) Filed: Oct. 19, 2006

(65) Prior Publication Data

US 2007/0111683 A1    May 17, 2007

(30) Foreign Application Priority Data

Oct. 21, 2005   (FR)  .................................. 05 10767

(51) Int. Cl.
*H04B 1/04*   (2006.01)

(52) U.S. Cl. ................. 455/127.1; 455/234.2; 455/333; 455/334

(58) Field of Classification Search ... 455/232.1–253.2, 455/127.1–127.5, 118, 313–334; 359/327, 359/355–359, 120
See application file for complete search history.

(56) References Cited

U.S. PATENT DOCUMENTS

| | | | | |
|---|---|---|---|---|
| 5,864,255 | A * | 1/1999 | Kwok et al. | 327/359 |
| 6,212,369 | B1 | 4/2001 | Avasarala | 455/333 |
| 7,321,751 | B2 * | 1/2008 | Sorrells et al. | 455/118 |
| 7,433,658 | B1 * | 10/2008 | Shirvani-Mahdavi et al. | 455/127.2 |
| 7,469,137 | B2 * | 12/2008 | Jensen | 455/333 |
| 2003/0045263 | A1 | 3/2003 | Wakayama et al. | 455/323 |
| 2003/0181189 | A1 * | 9/2003 | Sorrells et al. | 455/314 |
| 2004/0157568 | A1 * | 8/2004 | Asam | 455/127.1 |
| 2005/0143028 | A1 * | 6/2005 | Zheng et al. | 455/127.1 |

FOREIGN PATENT DOCUMENTS

EP     1065785     1/2001

* cited by examiner

*Primary Examiner*—Lana N Le
(74) *Attorney, Agent, or Firm*—Lisa K. Jorgenson; Allen, Dyer, Doppelt, Milbrath & Gilchrist, P.A.

(57) ABSTRACT

A radio frequency stage comprises an analog multiplier cell, and an analog current routing cell coupled thereto. The analog multiplier cell includes an input for receiving an input current having a DC component and a radio frequency dynamic component, and a controllable current source for delivering a DC control current. A current multiplication circuit generates an output current having a radio frequency dynamic component equal to a product of the dynamic component of the input current times a multiplier coefficient dependent on a ratio between a value proportional to that of the DC control current and a value of the DC component of the input current. An output delivers the output current. The analog current routing cell includes an input coupled to the output of the analog multiplier cell. A controllable voltage source delivers a control voltage and a routing circuit for routing a part of the input current to the output of the analog routing cell as a function of the value of the control voltage.

30 Claims, 7 Drawing Sheets

CONTROLLABLE RADIO FREQUENCY STAGE WITH VARIABLE GAIN/ATTENUATION, IN PARTICULAR INCORPORATED INTO THE TRANSMISSION CHAIN OF A CELLULAR MOBILE TELEPHONE, AND CORRESPONDING CONTROL METHOD

FIELD OF THE INVENTION

The invention relates to variable-gain stages for amplifying and/or attenuating signals. The invention applies in particular, but is not limited to, cellular mobile telephones having transmission chains incorporating such an amplifier/attenuator stage with variable gain.

BACKGROUND OF THE INVENTION

Variable-gain stages incorporated into the transmission chains of cellular mobile telephones are generally made up of amplifier cells comprising capacitive inductive resonant circuits (LC), and attenuator cells. In particular, such an architecture exhibits drawbacks with current consumption. Generally, the performance of such an architecture is optimized for maximum output power whereas most of the time the telephone operates at an intermediate power.

Moderate reductions in current may be obtained by supplementing with additional circuitry at the level of the biasing of the transistors of these cells. As a result, this further complicates the architecture and deforms the power supervision function, i.e., output power being dependent on the control voltage.

SUMMARY OF THE INVENTION

An object of the invention is to provide an amplifier/attenuator stage exhibiting a very significant dynamic swing in gain, for example, on the order of 90 dB. This is compatible with the CDMA2000 transmission standard while allowing the downstream use of the stage as a constant-gain power amplifier while reducing the average current consumption.

Another object of the invention is to provide an amplifier/attenuator stage exhibiting very good linearity, for example, an ACPR (Adjacent Channel Power Ratio) better than −57 dBc, and noise in the reception band of better than −137 dBm/Hz.

Yet another object of the invention is to provide such a stage exhibiting reduced proportions and a linear control of the gain.

The stage may have a low input impedance, a differential structure while being devoid of a complex biasing scheme and offer current consumption that decreases linearly as a function of output voltage.

According to one aspect, an electronic device comprises a controllable radio frequency stage with variable gain/attenuation. The radio frequency stage may comprise an analog multiplier cell and an analog current routing cell coupled thereto.

The analog multiplier cell may comprise input means for receiving an input current comprising a DC component and a radio frequency dynamic component, and a controllable current source for delivering a DC control current. There is also means of current multiplication for generating an output current whose radio frequency dynamic component is equal to the product of the dynamic component of the input current times a multiplier coefficient dependent on the ratio between a value proportional to that of the DC control current and the value of the DC component of the input current. Output means may deliver the output current The analog current routing cell may comprise input means linked to the output means of the multiplier cell, and a controllable voltage source for delivering a control voltage. There may also be routing means for routing a part of the input current to the output means of the routing cell as a function of the value of the control voltage.

Stated otherwise, the multiplier cell amplifies or attenuates the input current with a gain dependent on a ratio of DC currents. The bias current for the multiplier cell, which is equal to the DC control current, serves also to fix the gain. This makes it possible to obtain a current consumption that drops naturally with gain. One therefore obtains linear control of the gain using a DC current value.

Additionally, the value of the attenuation coefficient of the current routing cell has no influence on the current consumption.

The input impedance of the stage is low, thereby improving the linearity of a mixer (frequency transposition device) which might be upstream of the variable gain/attenuation stage. Neither does this stage comprise any inductive component, thereby making it possible to reduce the surface proportions thereof and to decrease the parasitic magnetic emissions.

It is particularly advantageous for the radio frequency stage to have a completely differential architecture (low common-mode gain). This renders it not sensitive to parasitic common-mode glitches. In particular, common-mode non-linearity of the mixer, if any, is eliminated.

According to one embodiment, compatible with a differential architecture, the current multiplication means may comprise a first pair of transistors respectively connected between the pair of inputs of the cell and a supply terminal, and having respective control electrodes linked together and to a voltage source.

The current multiplication means may also comprise a second pair of transistors respectively connected between the controllable current source and the pair of outputs of the multiplier cell, and having control electrodes respectively connected to the pair of inputs of the multiplier cell.

It is also possible to provide another embodiment of the invention, which is less dependent on the current gain of the transistors, thereby making it possible to further improve the operation thereof for high values of gain of the cell.

More precisely, according to such an embodiment, the multiplication means of the multiplier cell may comprise a first pair of NPN bipolar transistors respectively connected between the pair of inputs of the cell and a bias voltage source, and having bases respectively connected to the differential inputs.

The current multiplication means may also comprise a second pair of NPN bipolar transistors respectively connected between the controllable current source and the pair of outputs of the multiplier cell, and having bases respectively connected to the bases of the transistors of the first pair.

In either of these two embodiments, the radio frequency dynamic component of the output current of the multiplier cell is advantageously equal to the product of the dynamic component of the input current times a multiplier coefficient equal to the ratio between half the value of the DC control current and the value of the DC component of the input current.

According to another embodiment, the multiplier cell may furthermore comprise a third pair of transistors respectively connected between the inputs of the multiplier cell and the common outputs of the current routing cell. The transistors of the first pair and those of the third pair are respectively controlled by state control signals, each possessing first and second values. The first value provides the radio frequency stage with a first state in which the transistors of the first pair are on and the transistors of the third pair are off. The second value provides the radio frequency stage with a second state in which the transistors of the first pair are off and the transistors of the third pair are on.

Such an embodiment thus makes it possible to choose between a first state and a second state. In the second state, the input current is reused, for example the current originating from the modulator, whereas the latter is lost in the first state. The second state makes it possible to obtain a gain which is always greater than one and to save current in a ratio equal to (G+1)/G, where G is the gain of the current multiplier cell. Thus, for a gain of 10, 10% of the current is saved.

In such an embodiment, the radio frequency dynamic component of the output current in the first state is equal to the product of the dynamic component of the input current times a multiplier coefficient equal to the ratio between half the value of the DC control current and the value of the DC component of the input current. This is while the radio frequency dynamic component of the output current in the second state is equal to the product of the dynamic component of the input current times a multiplier coefficient equal to the ratio increased by one unit.

According to one embodiment, the input means of the current routing cell may comprise two inputs, the output means may comprise two outputs and the routing cell furthermore may comprise two control inputs linked to the controllable voltage source. The routing means of the current routing cell may comprise a fourth pair of transistors respectively connected between the two inputs and a supply terminal and whose control electrodes are each linked to a first control input. The current routing means additionally may comprise a fifth pair of transistors respectively connected between the two inputs and the two outputs, and having control electrodes each linked to the second control input.

To be able to process by choice two frequency bands, provision is advantageously made for the output means of the current routing cell to comprise two selectable different output pathways.

Stated otherwise, it is straightforward according to an embodiment of the invention, to produce a wide band stage offering a reduction in current while using a single chain (for example, a single modulator and a single current multiplier cell) and a current routing cell with two outputs.

More precisely, according to an embodiment, the current routing cell comprises two outputs situated on a first differential output pathway, and two additional outputs situated on an additional differential output pathway. The current routing cell may furthermore comprise an additional control input linked to an additional controllable voltage source, and the routing means may furthermore comprise a sixth pair of transistors respectively connected between the two inputs and the two additional outputs, and having control electrodes linked to the additional voltage source.

Such an embodiment is noteworthy in particular in the sense that it is totally unnecessary to provide any switch for selecting the two different output pathways. Specifically, a suitable adjustment of the voltages on the fourth, fifth and sixth pairs of transistors of the current routing cell makes it possible to naturally route the current to one or the other of the output pathways. Such an embodiment is perfectly compatible with the abovementioned embodiment with two selectable states.

According to yet another embodiment, there is a provision for the device to furthermore comprise means able to reduce the level of the input current of the controllable radio frequency stage with variable gain/attenuation. Thus, when the device furthermore comprises a frequency transposition module (mixer), delivering the input current, it is especially advantageous for the frequency transposition module to incorporate the means of reducing the level of the input current of the controllable radio frequency stage with variable gain/attenuation.

This makes it possible, in particular, to prevent the consumption current of the mixture from becoming significant with respect to the current consumed by the amplifier stage with variable gain/attenuation.

According to an embodiment of the invention, the device may furthermore comprise control means able to control the current source of the current multiplier cell, and the voltage source of the current routing cell as a function of a desired global gain/attenuation value.

According to another aspect of the invention, an element is provided to form part of a wireless communication system, for example a mobile terminal, comprising a transmission chain incorporating a device as defined above. Such a mobile terminal may for example be a cellular mobile terminal or any other mobile object such as, for example, a personal digital assistant (PDA).

When the transmission chain incorporates baseband processing means, the processing means may incorporate at least a part of the means of control of the current source and of the voltage source of the current routing cell.

According to another aspect of the invention, a method is also provided for controlling the variable gain/attenuation radio frequency stage of a device as defined above. This method may comprise a first phase in which the value of the gain/attenuation of the multiplier cell is adjusted while fixing the attenuation coefficient of the current routing cell at 0 dB, then possibly a second phase in which the value of the attenuation coefficient of the current routing cell is adjusted.

Stated otherwise, according to this aspect, there is provision to act by priority on the gain of the multiplier cell to undertake amplification or attenuation. If this is not sufficient, one then acts on the attenuation coefficient of the current routing cell to optimize the average consumption.

As a variation, it is also possible in the first phase to undertake a reduction in the value of the DC component of the input current. That is, when a modulator is present, for example, there is a decrease for the gain of this modulator.

BRIEF DESCRIPTION OF THE DRAWINGS

Other advantages and characteristics of the invention will become apparent on examining the detailed description of non-limiting embodiments and modes of implementation, and of the appended drawings in which.

DETAILED DESCRIPTION OF THE PREFERRED EMBODIMENTS

Figure 1:
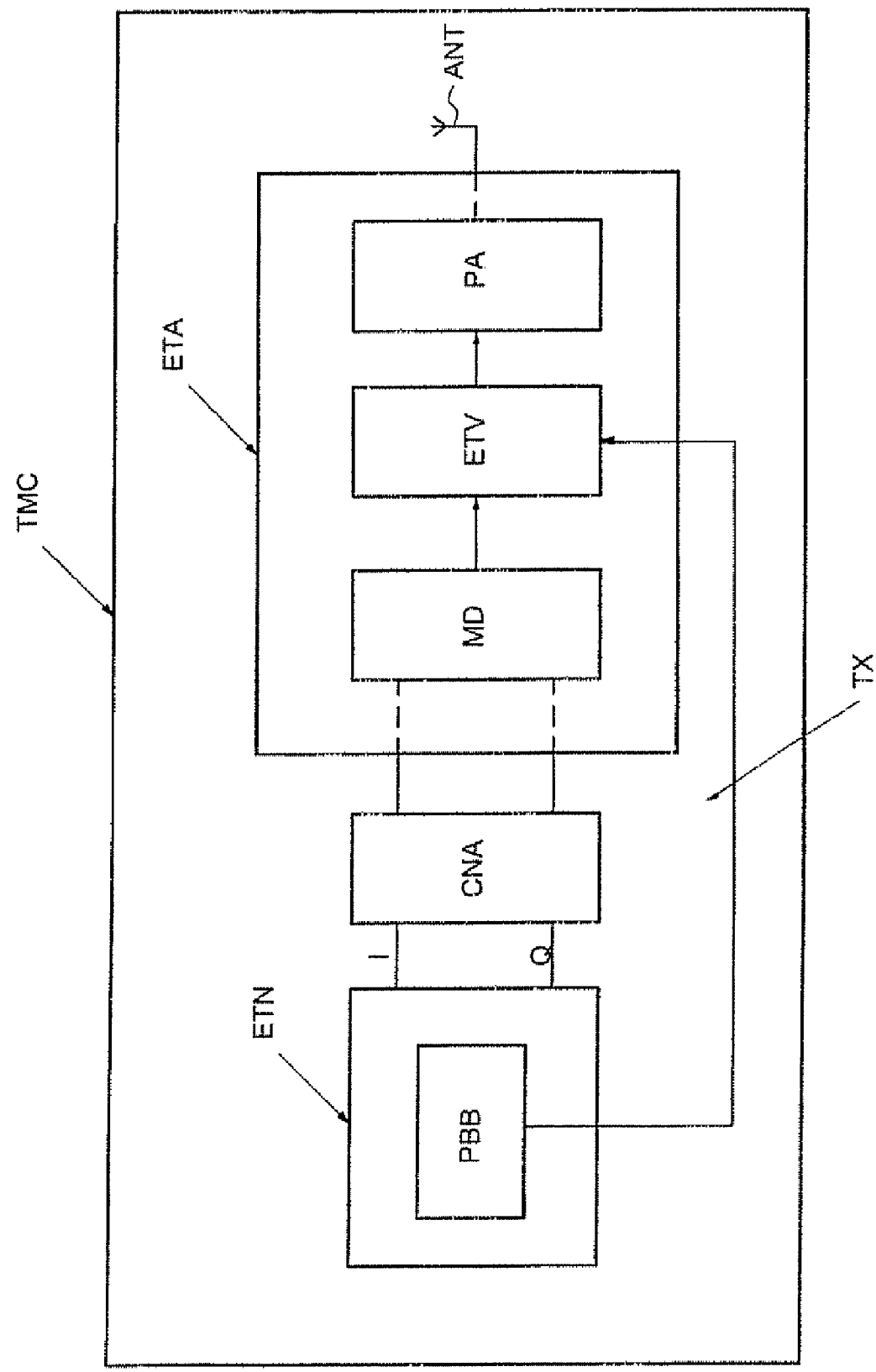
FIG. 1 diagrammatically illustrates an embodiment of a device according to the invention.

In FIG. 1, the reference TMC designates a cellular mobile telephone comprising a transmission chain TX. The transmission chain TX comprises a digital stage ETN incorporating in a conventional manner baseband processing means PBB for delivering digital samples on two pathways mutually in phase quadrature, namely an in-phase pathway I and a phase quadrature pathway Q. The baseband processing means PBB can be embodied in hardware and/or software within a processor.

The digital stage ETN is linked to an analog block ETA by a digital-to-analog convertor CNA. The analog block ETA conventionally comprises a mixer MD which is also called a frequency transposition device that is capable of converting the baseband analog signal into a radio frequency signal. The mixer MD is linked at an output to a variable gain/attenuation radio frequency stage ETV.

The value of the gain of this stage ETV may be greater than 1 (amplification) or less than 1 (attenuation) and is controlled by the baseband processing means PBB as a function of a desired power value at the output of the antenna. The analog block ETA comprises a power amplifier PA of conventional structure, which in the present case is a constant-gain amplifier. This amplifier is linked at output to the antenna ANT of the telephone.

Figure 2:
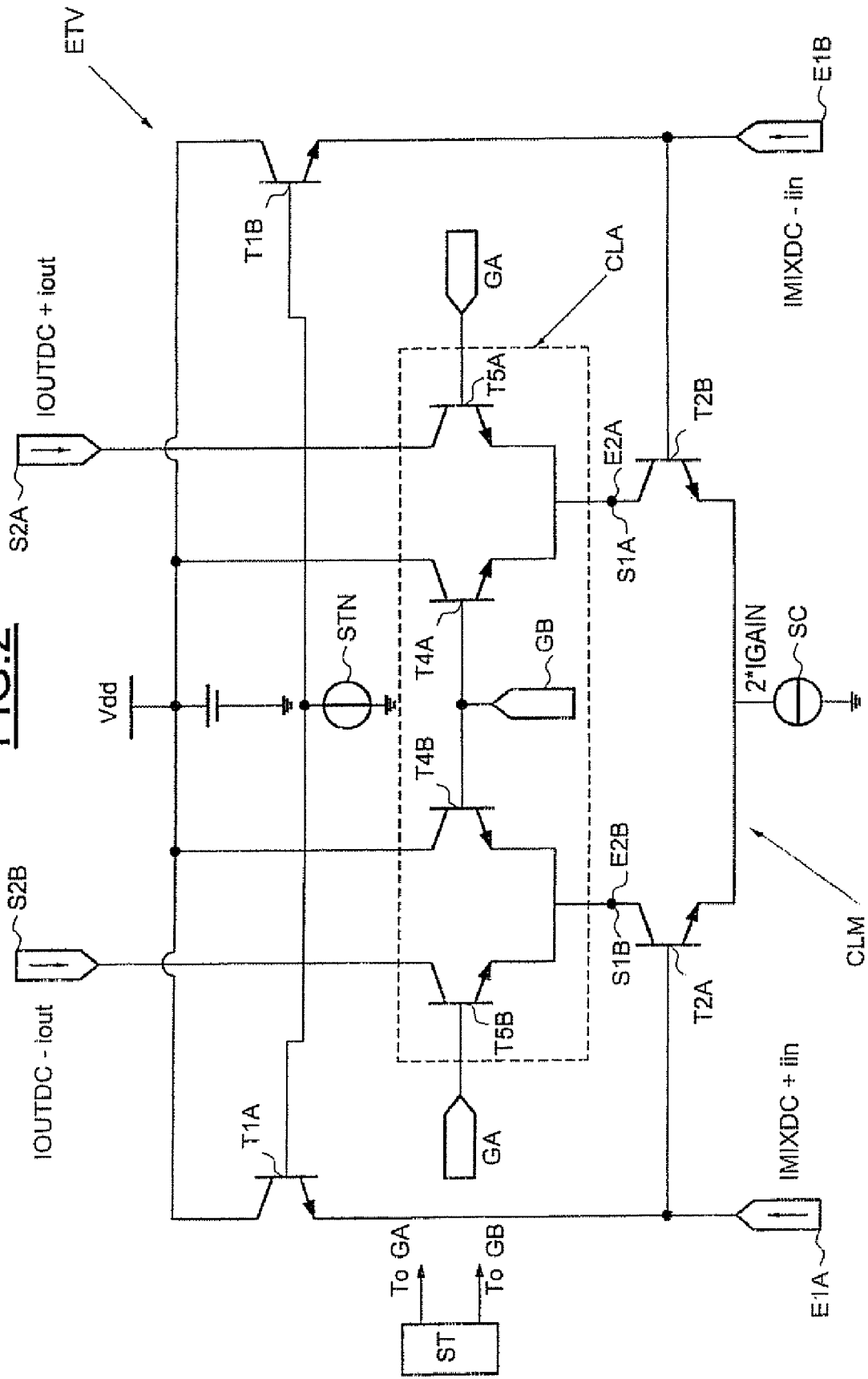
FIG. 2 illustrates in greater detail, but still diagrammatically, an embodiment of a radio frequency stage with variable gain/attenuation according to the invention.

FIG. 2 illustrates an embodiment of a totally differential architecture of an ETV stage. More precisely, this stage ETV comprises two cells, namely an analog multiplier cell CLM and an analog current routing cell CLA.

The analog multiplier cell CLM comprises a pair of inputs E1A and E1B for receiving an input current comprising a DC component IMIXDC and a radio frequency dynamic component iin. The DC component IMIXDC is in fact the DC component of the output current of the mixer MD.

The cell CLM comprises a pair of outputs S1B and S1A which also form the pair of inputs E2B and E2A of the current routing cell CLA. The cell CLM also comprises a controllable current source SC delivering a DC control current whose value is equal to 2*IGAIN.

The cell CLM additionally comprises current multiplication means possessing a first pair of transistors T1A and T1B respectively connected between the input pair E1A and E1B and the supply terminal Vdd. The bases of these two transistors T1A and T1B are together linked to a voltage source STNE Although bipolar transistors are described, the embodiment of FIG. 2 could be envisaged with MOS transistors operating in identical current/voltage operating spans.

The current multiplication means additionally comprises a second pair of bipolar transistors T2A and T2B. The emitters of these two transistors T2A and T2B are connected to the output of the controllable current source SC while the collectors of these transistors in fact form the output terminals S1B and S1A. The bases of these bipolar transistors T2A and T2B are respectively connected to the two inputs E1A and E1B, and consequently to the emitters of the two transistors T1A and T1B.

Figure 3:
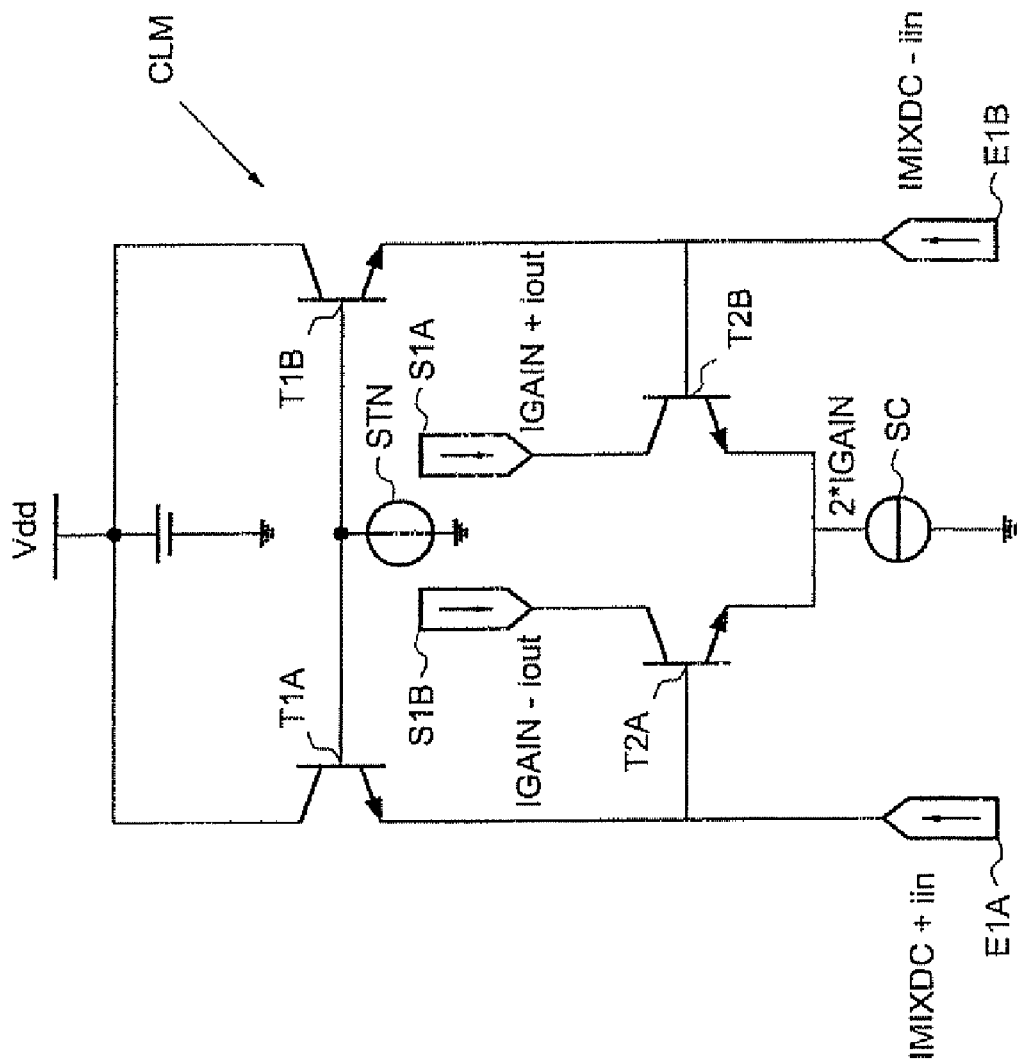
FIG. 3 illustrates in greater detail but still diagrammatically a part of the stage of FIG. 2.

As illustrated more particularly in FIG. 3, the cell CLM delivers an output current having a DC component equal to IGAIN and a radio frequency dynamic component iout. This cell amplifies or attenuates the dynamic input current with a gain dependent on a ratio of DC currents. More precisely, the ratio iouit/iin of the output current to the input current is equal to the ratio IGAIN/IMIXDC of the DC components of the output and input currents.

However, as the DC component of the output current is equal to half the value of the current delivered by the current source SC, it is seen that the ratio iout/iin is equal to the ratio between half the value of the DC control current (2*IGAIN) and the value of the DC component of the input current.

Thus, the consumption of current of a mobile telephone will decrease when the output power requested decreases. Since most of the time the telephone operates at intermediate powers, the duration of communication can be increased.

Referring again to FIG. 2, the current routing cell CLA comprises two inputs E2B and E2A, two outputs S2B and S2A and two control inputs GA and GB. The cell also comprises routing means comprising a fourth pair of transistors T4A and T4B respectively connected between the two inputs E2A and E2B and the supply terminal Vdd. The bases of these transistors T4A and T4B are linked to the control input GB. The routing means also comprise a fifth pair of transistors T5A and T5B respectively connected between the two inputs E2A and E2B and the two outputs S2A and S2B of the cell CLA. The bases of these two transistors T5A and T5B are linked to the control input GA.

As a function of the difference between the voltage values applied to the inputs GB and GA, a more or less significant fraction of the input current of the cell CLA is dissipated in the supply Consequently, the other part of the current is delivered at output, thereby making it possible to produce an attenuation cell. A voltage source ST making it possible to generate the various voltages on the control terminals GA and GB is conventional. The article by Sudhir Aggarwal, titled "A Single-State Variable-Gain Amplifier With 70-dB Dynamic Range for CDMA2000 Transmit Applications" IEEE Journal of Solid-State Circuits, vol. 38, no. 6, June 2003 discloses an exemplary embodiment of such a voltage source.

The value of the attenuation coefficient of the current routing cell has no impact on the consumption of current of the stage ETV. As illustrated more particularly in FIG. 4, the baseband processing means PBB, which include means of control of the current source SC and of the voltage source ST, for example, embodied in the form of a software module or in hardware form, will act by priority on the value of the gain (or attenuation) of the multiplier cell CLM.

Figure 4:
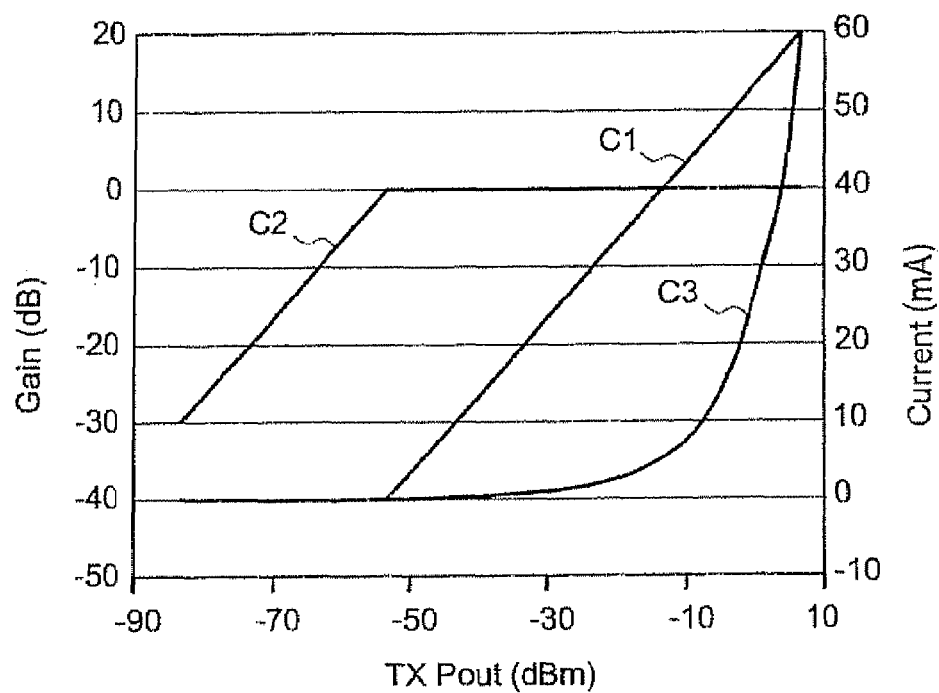
FIG. 4 illustrates a variation in gain and in consumption of current according to a mode of implementation of the invention.

More particularly, if it is assumed as in FIG. 4 that the multiplier cell has a dynamic swing in gain of 60 dB to obtain an output power of 10 dBm (obtained for a load of 200 ohms at the output of the stage ETV), the value of the gain of the cell CLM will be fixed at 20 dB, for example, whereas the value of the gain of the current routing cell is fixed at 0 dB. This corresponds to a unit gain which is its maximum.

To decrease the output power TXPout to −50 dBm, the value of the gain of the routing cell is left unchanged (curve C2) and the value of the gain of the cell CLM is decreased (curve C1).

When the value of the gain of this cell has reached its minimum value (−40 dB in the example), the value of the gain of the current routing cell is then decreased so as to descend progressively to −30 dB and reach an output power of −80 dBm. The CDMA2000 specification is then perfectly fulfilled in terms of noise and of ACPR, and is over a dynamic swing of 90 dB in gain while having a current consumption which decreases with power requested (curve C3).

Figure 5:
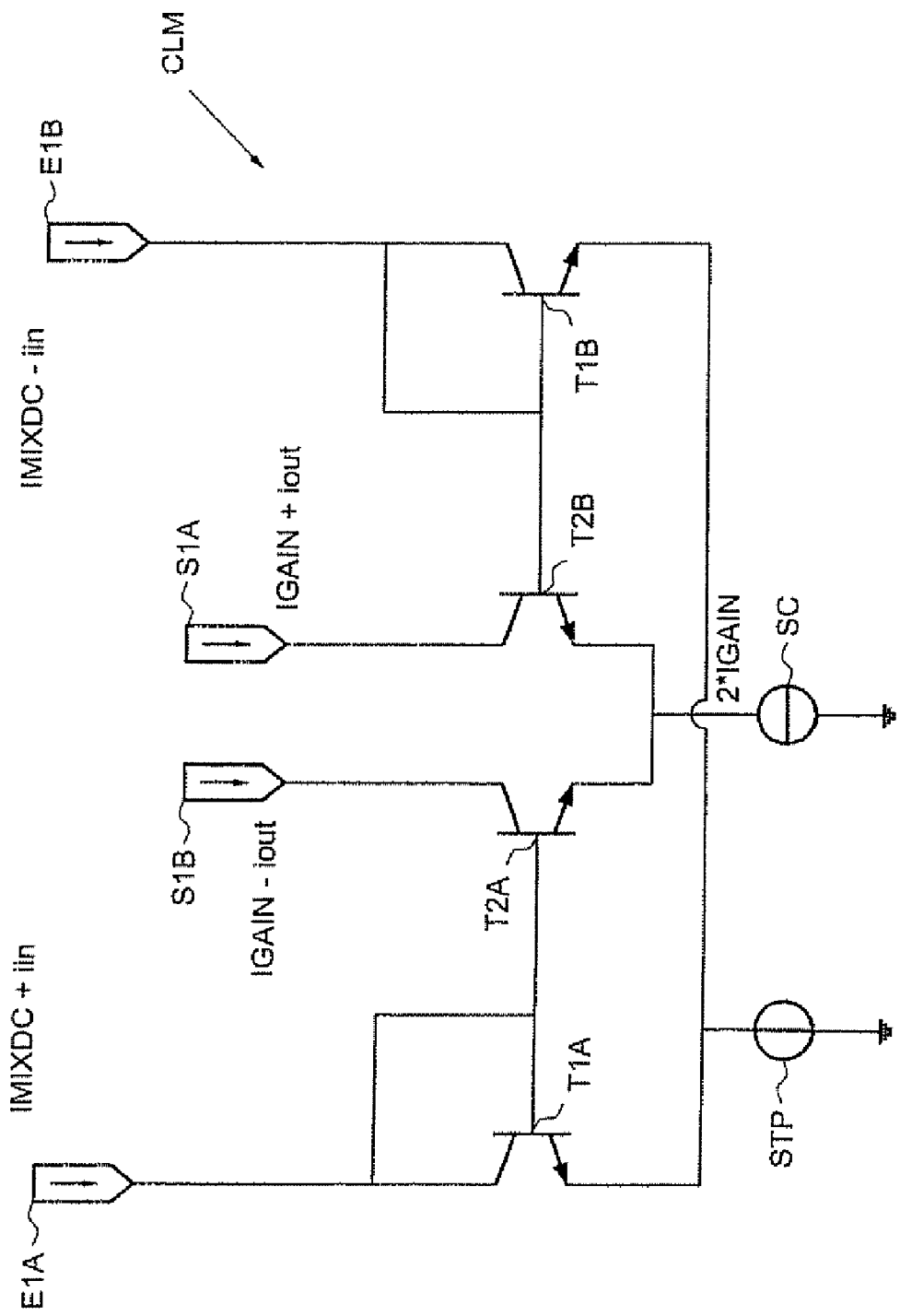
FIG. 5 diagrammatically illustrates another embodiment of a part of a stage according to the invention.

Reference is now made more particularly to FIG. 5 to describe another embodiment of the analog multiplier cell CLM. Only the differences between FIGS. 3 and 5 will be described for simplification purposes.

The embodiment of FIG. 5 is not sensitive to the current gain β of the transistors, thereby making it possible to have optimized operation for high values of gain of the cell. Relative to the embodiment of FIG. 3, the inputs E1A and E1B of the cell are formed by the collectors of the transistors T1A and T1B. Additionally, the collectors of these transistors are connected to the bases of these same transistors and these bases are respectively connected to the bases of the transistors T2A and T2B.

Furthermore, the emitters of the transistors T1A and T1B are biased by a bias voltage source STP. This embodiment exhibits the same transfer function as that of the embodiment of FIG. 3.

Figure 6:
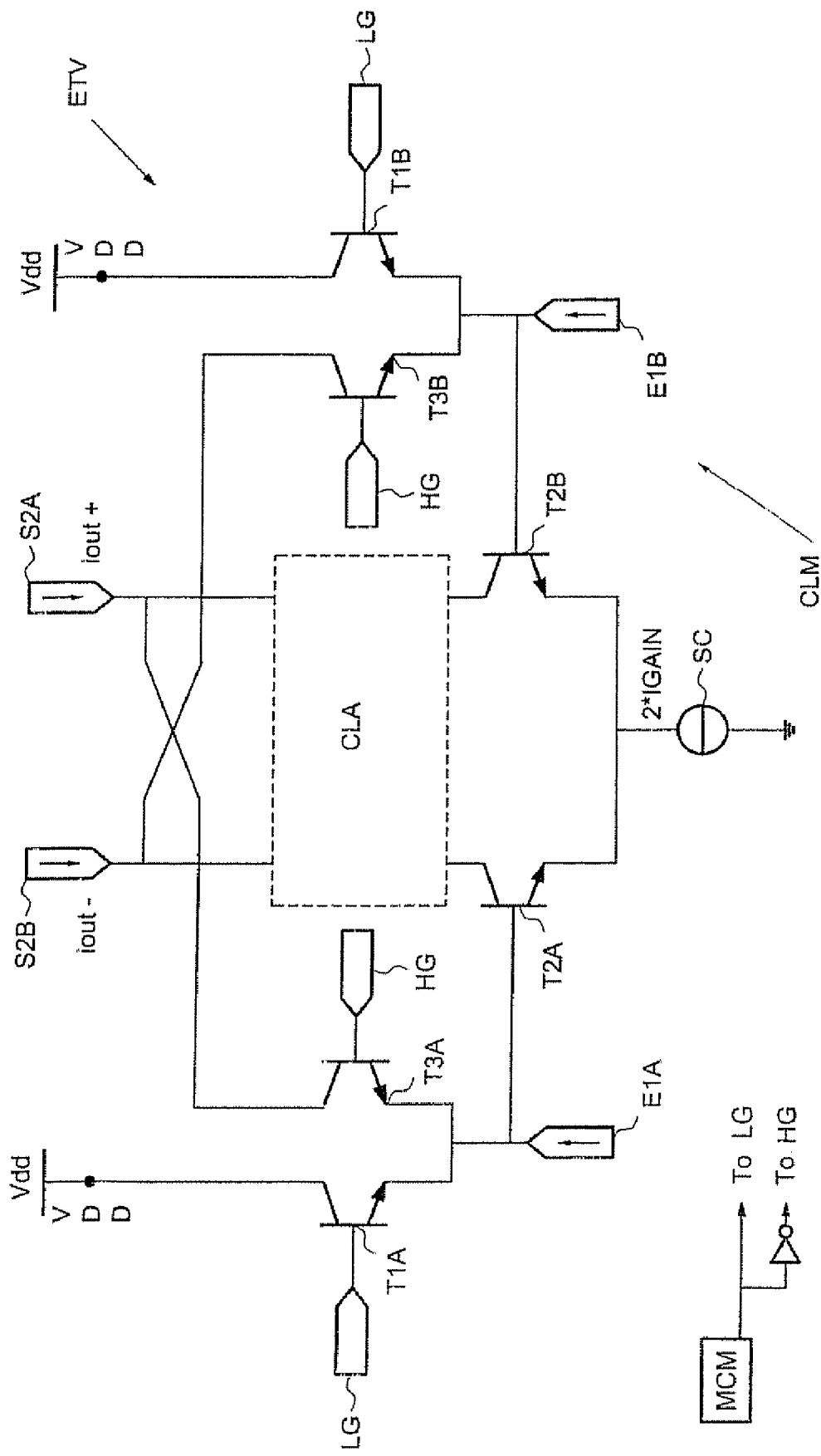
FIG. 6 diagrammatically illustrates yet another embodiment of a radio frequency stage with variable gain/attenuation according to the invention.

Reference will now be made more particularly to FIG. 6 to illustrate an embodiment making it possible to reuse, on command, the input current of the cell CLM, with the input current emanating from the mixer, for example. Here again, for simplification purposes, only the differences between FIGS. 2 and 6 will now be described.

Furthermore, in FIG. 6, the current routing cell CLA, identical to that of FIG. 2, has not been represented in detail.

Relative to the embodiment of FIG. 2, the multiplication cell CLM comprises a third pair of NPN bipolar transistors, T3A and T3B. The emitter of the transistors T3A is connected to the input E1A and to the base of the transistor T2A, whereas the emitter of the transistors T3B is connected to the input E1B and to the base of the transistor T2B. The collector of the transistor T3A is linked to the output S2A while the collector of the transistor T3B is connected to the output S2B.

The bases of the transistors T1A and T1B are connected to a first state control input LG while the bases of the transistor T3A and T3B are connected to a second state control input HG. Control means MCM are then able to deliver respectively voltages LG and HG on the control inputs LG and HG. These voltages LG and HG act as state control signals. In a first state, for example, when the voltage LG is greater than the voltage HG, the transistors T1A and T1B are on and the transistors T3A and T3B are off. In this first state, the configuration of FIG. 2 therefore prevails again.

On the other hand, in a second state, for example when the voltage HG is greater than the voltage LG, the transistors T1A and T1B are off while the transistors T3A and T3B are on. In this case, the input current is summed at the output S2A and S2B of the stage ETV. The gain of the cell CLM then becomes equal to IGAIN/IMIXDC+1.

It is therefore noted that in this second state, the gain is always greater than 1, and the fraction of current recovered is equal to (G+1)/G, where G is the gain of the cell CLM. Thus, for G=10, 10% of the current is recovered. The means MCM may be embodied in part in the baseband processing means PBB in regards to the digital part of the control, and in part by conventional logic circuits for the production of the logic control voltages.

Figure 7:
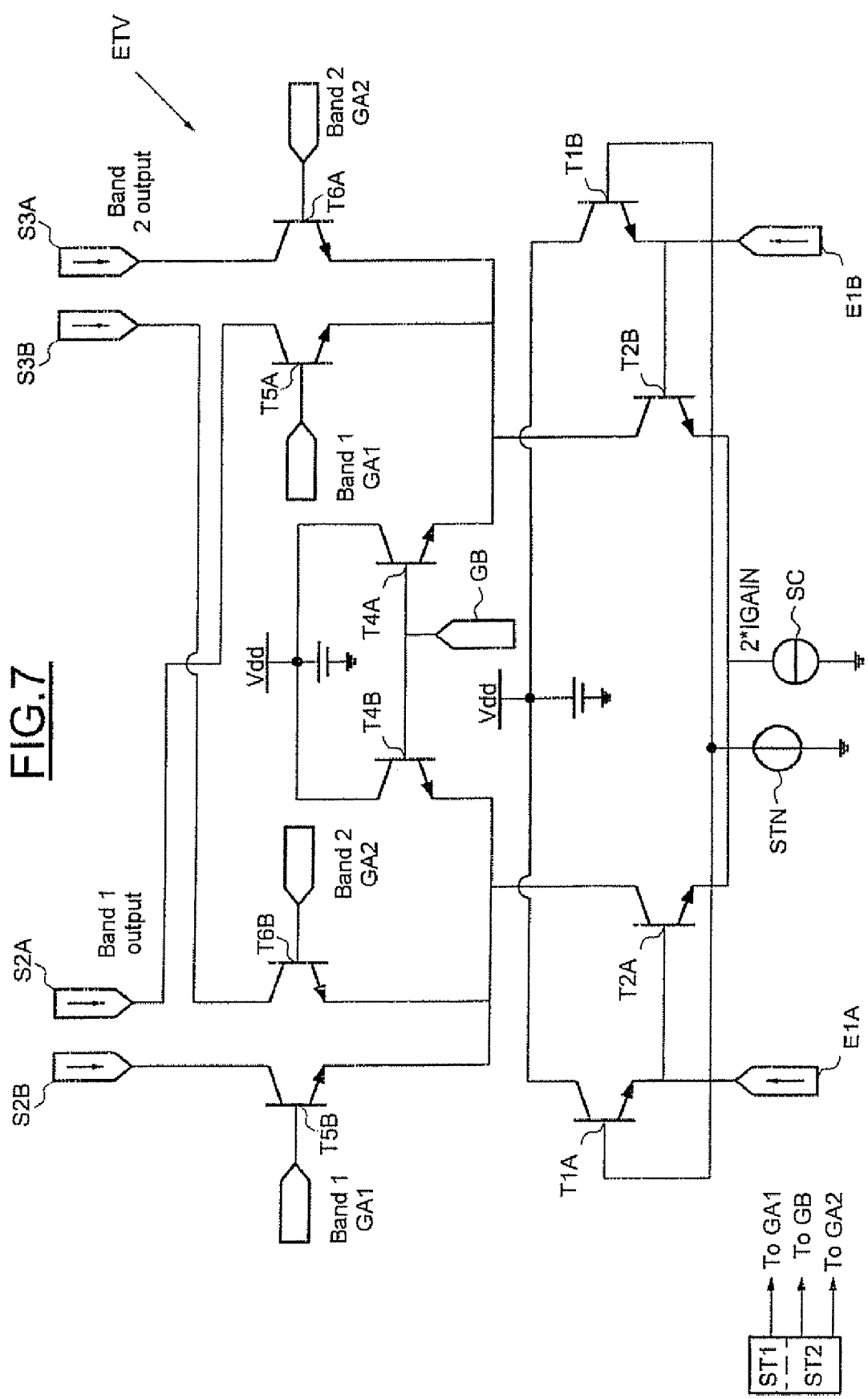
FIG. 7 diagrammatically illustrates another embodiment of a stage according to the invention.

Reference is now made more particularly to FIG. 7 to describe an embodiment compatible with its incorporation into a dual-band cellular mobile telephone, for example. Here again, only the differences relative to FIG. 2 will now be described.

In this embodiment, the output means of the current routing cell comprise two selectable different differential output pathways. More precisely, the outputs S2A and S2B form the output of a first differential pathway while the outputs S3A and S3B form the output of an additional differential pathway.

Furthermore, the current routing means comprise a sixth pair of transistors T6A and T6B. The collectors of these transistors T6A and T6B are connected to the additional outputs S3A and S3B while the emitters of these transistors are connected, just like the emitters of the transistors T5A and T5B, to the emitters of the transistors T4A and T4B.

The control inputs GA1 are linked to the bases of the transistors T5A and T5B while the additional control inputs GA2 are linked to the bases of the transistors T6A and T6B. The controllable voltage source comprises two blocks ST1, ST2 capable of delivering the control voltages on the inputs GA1, GA2 and GB.

The selection of an output pathway is performed without requiring any switch, It simply suffices to choose appropriate differences in voltage between the terminals GA1, GB on the one hand and GA2 and GB on the other hand. Thus, if one wishes to select the output pathway S3A and S3B, the voltages GA2 and GB will be fixed so as to have the desired gain and the voltage GA1 well below the smaller of the two voltages GA2 and GB. In this case, the output current will be routed via the transistors T6A and T6B.

If conversely one wishes to select the pathway S2A and S2B, the voltage GA2 will be chosen well below the smaller of the two voltages GA1 and GB. Thus, such a stage may be implemented in a dual-band telephone capable of operating for example according to the CELL standard or the PCS standard which exhibit different frequency bands.

Of course, the embodiment of FIG. 7 is perfectly compatible with the embodiment of FIG. 6, the characteristics of these two modes being combinable. It was shown above that the consumption of current of the stage decreased with the desired output power. The current emanating from the mixer may then become predominant.

Figure 8:
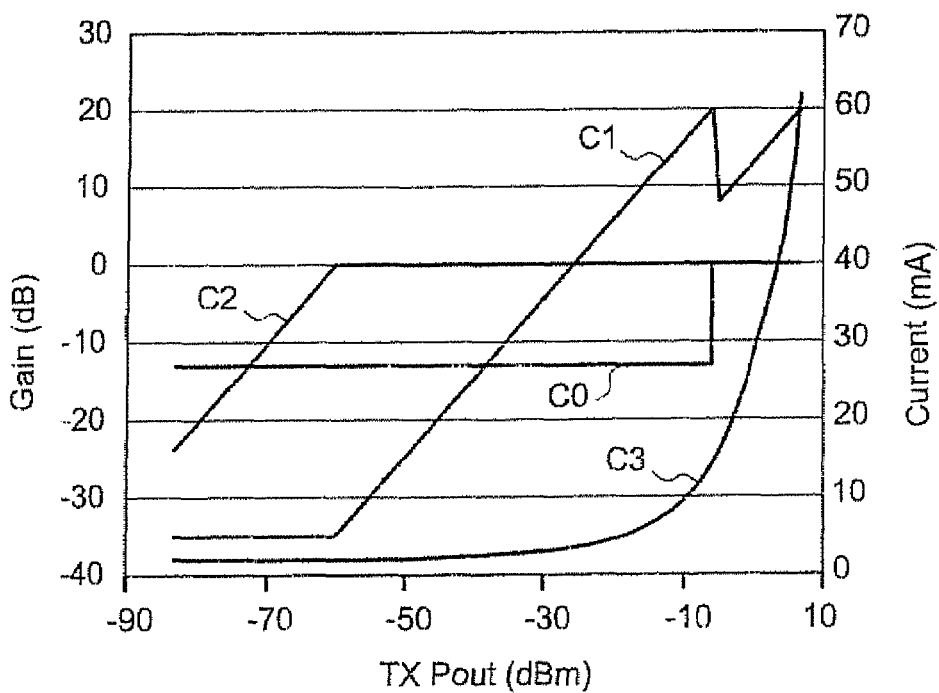
FIG. 8 diagrammatically illustrates other curves relating to time dependent profiles of gain and of current consumption and pertaining to another mode of implementation of the invention.

Also, in order to further optimize the overall consumption of current, there is provision, as illustrated in FIG. 8, to decrease the gain of the mixer after a first diminution of the gain of the multiplier cell.

More precisely, returning to the same conditions as those of FIG. 4, it may be seen that in order to go from an output power of 10 dBm to −10 dBm, the gain of the multiplier cell is first decreased (curve C1) while leaving fixed at 1 (0 dB) the gains of the current routing cell (curve C2) and of the mixer (curve C0).

Next, the gain of the mixer is decreased for example by around 10 dB and the gain of the multiplier cell is increased simultaneously by the same value. Thereafter, to further decrease the output power, the gain of the mixer is left unchanged (curve C0) and the gain of the multiplier cell is decreased to its minimum (curve C1) before possibly acting on the attenuation coefficient of the current routing cell (curve C2).

This then results, as illustrated by curve C3, in an appreciable decrease in the overall current consumption. Here again, this mode of implementation is perfectly compatible and may be combined with the embodiments illustrated in FIGS. 2 and/or 6 and/or 7.

The invention just described has in particular the following advantages. The device fully satisfies the CDMA2000 specifications in terms of noise and ACPR over 90 dB of dynamic swing. The current consumption decreases linearly with output power without requiring any complex biasing scheme since a current source is used both to bias the stage and to adjust the gain. The input of the stage exhibits a low impedance, thereby improving the linearity of the mixer. The input of the stage may be completely differential, thereby rendering it not sensitive to common mode parasitic signals. The absence of any inductive element makes it possible to obtain reduced surface proportions and a reduction in parasitic magnetic emissions. The architecture is compatible with a radio frequency integrated technology, for example, a Bi-CMOS 0.25 micron technology and a cellular mobile telephone environment, for example, 3.1 volts on the battery and 9 dBm of maximum output power.

That which is claimed:

1. An electronic device comprising:
  a controllable radio frequency stage with variable gain/attenuation comprising
  an analog multiplier cell comprising
    at least one input for receiving an input current comprising a DC component and a radio frequency dynamic component,
    a controllable current source for delivering a DC control current,
    a current multiplication circuit for generating an output current whose radio frequency dynamic component is equal to a product of a dynamic component of the input current times a multiplier coefficient dependent on a ratio between a value proportional to that of the DC control current and a value of the DC component of the input current, and
    at least one output for delivering the output current; and
  an analog current routing cell comprising
    at least one input coupled to said at least one output of said analog multiplier cell,
    a controllable voltage source for delivering a control voltage,
    at least one output, and
    a routing circuit for routing a part of the input current to the at least one output of said analog current routing cell as a function of the value of the control voltage.

2. An electronic device according to claim 1, wherein said controllable radio frequency stage has a differential architecture.

3. An electronic device according to claim 2, wherein said at least one input and said at least one output for said analog multiplier cell comprises a pair of inputs and a pair of outputs; and wherein said current multiplication circuit comprises:
  a first pair of transistors respectively coupled between said pair of inputs and a supply terminal, and comprising respective control terminals coupled together; and
  a second pair of transistors respectively coupled between said controllable current source and said pair of outputs, and comprising control terminals respectively coupled to said pair of inputs.

4. An electronic device according to claim 3, wherein the radio frequency dynamic component of the output current of said analog multiplier cell is equal to the product of the dynamic component of the input current times the multiplier coefficient that is equal to the ratio between half the value of the DC control current and the value of the DC component of the input current.

5. An electronic device according to claim 3, wherein said analog multiplier cell further comprises:
  a third pair of transistors respectively coupled between said pair of inputs of said analog multiplier cell and common outputs of said analog current routing cell;
  said first pair of transistors and said third pair of transistors being controlled by state control signals each including a first value for providing said controllable radio frequency stage with a first state in which said first pair of transistors are conducting and said third pair of transistors are not conducting, and a second value providing said controllable radio frequency stage with a second state in which said first pair of transistors are not conducting and said third pair of transistors are conducting.

6. An electronic device according to claim 5, wherein the radio frequency dynamic component of the output current of said analog multiplier cell in the first state is equal to the product of the dynamic component of the input current times a multiplier coefficient equal to the ratio between half the value of the DC control current and the value of the DC component of the input current, and the radio frequency dynamic component of the output current in the second state is equal to the product of the dynamic component of the input current times a multiplier coefficient equal to the ratio increased by one.

7. An electronic device according to claim 3, wherein said at least one input and said at least one output for said analog current routing cell comprises a pair of inputs coupled to said controllable voltage source and a pair of outputs; and wherein said routing circuit comprises:
  a fourth pair of transistors respectively coupled between said pair of inputs and a supply terminal, and comprising control terminals coupled together; and
  a fifth pair of transistors respectively coupled between said pair of inputs and said pair of outputs, and comprising control terminals respectively coupled to an input of said analog current routing cell.

8. An electronic device according to claim 2, wherein said at least one input and said at least one output for said analog multiplier cell comprises a pair of inputs and a pair of outputs; and wherein said current multiplication circuit comprises:
  a first pair of NPN bipolar transistors respectively coupled between said pair of inputs and a voltage source, and comprising emitter terminals respectively coupled to said pair of inputs; and
  a second pair of NPN bipolar transistors respectively coupled between said controllable current source and said pair of outputs, and comprising base terminals respectively coupled to the emitter terminals of said first pair of NPN bipolar transistors.

9. An electronic device according to claim 1, wherein said at least one output of said analog current routing cell comprises two different selectable outputs.

10. An electronic device according to claim 9, wherein the two different selectable outputs comprise a first pair of outputs, and an additional pair of outputs; and wherein said first pair of outputs are on a first differential output path, and said additional pair of outputs are on an additional output path; and further comprising an additional control input coupled to an additional controllable voltage source, and wherein said routing circuit further comprising a sixth pair of transistors respectively coupled between two inputs and said pair of additional outputs, and comprising control terminals coupled to said additional voltage source.

11. An electronic device according to claim 1, further comprising a mixer coupled to said controllable radio frequency stage for providing the input current, and for reducing a level of the input current with variable gain/attenuation.

12. An electronic device according to claim 11, furthermore comprising a processor coupled to said mixer for controlling said current source and said voltage source as a function of a desired global gain/attenuation value.

13. A wireless communications device comprising
  a digital stage for providing a digital input signal;

a digital-to-analog converter coupled to said digital stage for converting the digital input signal to an analog input signal; and an analog stage coupled to said digital-to-analog converter and comprising an analog multiplier cell comprising at least one input for receiving the analog input signal current comprising a DC component and a radio frequency dynamic component, a controllable current source for delivering a DC control current, a current multiplication circuit for generating an output current whose radio frequency dynamic component is equal to a product of a dynamic component of the analog input signal times a multiplier coefficient dependent on a ratio between a value proportional to that of the DC control current and a value of the DC component of the analog input signal, and at least one output for delivering the output current; and an analog current routing cell comprising at least one input coupled to said at least one output of said analog multiplier cell, a controllable voltage source for delivering a control voltage, at least one output, and a routing circuit for routing a part of the input current to the at least one output of said analog current routing cell as a function of the value of the control voltage.

14. A wireless communications device according to claim 13, wherein said digital stage comprises a processor for controlling the input signal as a function of a desired global gain/attenuation value.

15. A wireless communications device according to claim 14, wherein said digital stage, said digital-to-analog converter and said analog stage are configured so that the wireless communications device is a cellular mobile phone.

16. A wireless communications device according to claim 13, wherein said at least one input and said at least one output for said analog multiplier cell comprises a pair of inputs and a pair of outputs; and wherein said current multiplication circuit comprises:

a first pair of transistors respectively coupled between said pair of inputs and a supply terminal, and comprising respective control terminals coupled together; and a second pair of transistors respectively coupled between said controllable current source and said pair of outputs, and comprising control terminals respectively coupled to said pair of inputs.

17. A wireless communications device according to claim 16, wherein the radio frequency dynamic component of the output current of said analog multiplier cell is equal to the product of the dynamic component of the input current times the multiplier coefficient that is equal to the ratio between half the value of the DC control current and the value of the DC component of the input current.

18. A wireless communications device according to claim 16, wherein said analog multiplier cell further comprises:

a third pair of transistors respectively coupled between said pair of inputs of said analog multiplier cell and common outputs of said analog current routing cell;

said first pair of transistors and said third pair of transistors being controlled by state control signals each including a first value for providing said controllable radio frequency stage with a first state in which said first pair of transistors are conducting and said third pair of transistors are not conducting, and a second value providing said controllable radio frequency stage with a second state in which said first pair of transistors are not conducting and said third pair of transistors are conducting.

19. A wireless communications device according to claim 18, wherein the radio frequency dynamic component of the output current of said analog multiplier cell in the first state is equal to the product of the dynamic component of the input current times a multiplier coefficient equal to the ratio between half the value of the DC control current and the value of the DC component of the input current, and the radio frequency dynamic component of the output current in the second state is equal to the product of the dynamic component of the input current times a multiplier coefficient equal to the ratio increased by one.

20. A wireless communications device according to claim 16, wherein said at least one input and said at least one output for said analog current routing cell comprises a pair of inputs coupled to said controllable voltage source and a pair of outputs; and wherein said routing circuit comprises:

a fourth pair of transistors respectively coupled between said pair of inputs and a supply terminal, and comprising control terminals coupled together; and a fifth pair of transistors respectively coupled between said pair of inputs and said pair of outputs, and comprising control terminals respectively coupled to an input of said analog current routing cell.

21. A wireless communications device according to claim 13, wherein said at least one output of said analog current routing cell comprises two different selectable outputs; wherein the two different selectable outputs comprise a first pair of outputs, and an additional pair of outputs; and wherein said first pair of outputs are on a first differential output path, and said additional pair of outputs are on an additional output path; and further comprising an additional control input coupled to an additional controllable voltage source, and wherein said routing circuit further comprising a sixth pair of transistors respectively coupled between two inputs and said pair of additional outputs, and comprising control terminals coupled to said additional voltage source.

22. A method for controlling a variable gain/attenuation radio frequency stage in an electronic device, the variable gain/attenuation radio frequency stage comprising an analog multiplier cell comprising at least one input for receiving an input current comprising a DC component and a radio frequency dynamic component, a controllable current source for delivering a DC control current, a current multiplication circuit for generating an output current whose radio frequency dynamic component is equal to a product of a dynamic component of the input current times a multiplier coefficient dependent on a ratio between a value proportional to that of the DC control current and a value of the DC component of the input current, and at least one output for delivering the output current; and an analog current routing cell comprising at least one input coupled to the at least one output of the analog multiplier cell, a controllable voltage source for delivering a control voltage, at least one output, and a routing circuit for routing a part of the input current to the at least one output of the analog current routing cell as a function of the value of the control voltage, the method comprising:

performing a first phase in which a value of the gain/attenuation of the analog multiplier cell is adjusted while setting an attenuation coefficient of the analog current routing cell, and if necessary, performing a second phase in which a value of the attenuation coefficient is adjusted.

23. A method according to claim 22, wherein the attenuation coefficient of the analog current routing cell is set at 0 dB during the first phase.

24. A method according to claim 22, wherein the first phase further comprises reducing the value of the DC component of the analog input signal.

25. A method according to claim 22, wherein the digital stage comprises a processor for controlling the input signal as a function of a desired global gain/attenuation value.

26. A method according to claim 22, wherein the at least one input and the at least one output for the analog multiplier cell comprises a pair of inputs and a pair of outputs; and wherein the current multiplication circuit comprises a first pair of transistors respectively coupled between the pair of inputs and a supply terminal, and comprising respective control terminals coupled together; and a second pair of transistors respectively coupled between the controllable current source and the pair of outputs, and comprising control terminals respectively coupled to the pair of inputs.

27. A method according to claim 26, wherein the radio frequency dynamic component of the output current of the analog multiplier cell is equal to the product of the dynamic component of the input current times the multiplier coefficient that is equal to the ratio between half the value of the DC control current and the value of the DC component of the input current.

28. A method according to claim 26, wherein the analog multiplier cell further comprises a third pair of transistors respectively coupled between the pair of inputs of the analog multiplier cell and common outputs of the analog current routing cell; and the first pair of transistors and the third pair of transistors being controlled by state control signals each including a first value for providing the controllable radio frequency stage with a first state in which the first pair of transistors are conducting and the third pair of transistors are not conducting, and a second value providing the controllable radio frequency stage with a second state in which the first pair of transistors are not conducting and the third pair of transistors are conducting.

29. A method according to claim 28, wherein the radio frequency dynamic component of the output current of the analog multiplier cell in the first state is equal to the product of the dynamic component of the input current times a multiplier coefficient equal to the ratio between half the value of the DC control current and the value of the DC component of the input current, and the radio frequency dynamic component of the output current in the second state is equal to the product of the dynamic component of the input current times a multiplier coefficient equal to the ratio increased by one.

30. A method according to claim 26, wherein the at least one input and the at least one output for the analog current routing cell comprises a pair of inputs coupled to the controllable voltage source and a pair of outputs; and wherein the routing circuit comprises a fourth pair of transistors respectively coupled between the pair of inputs and a supply terminal, and comprising control terminals coupled together; and a fifth pair of transistors respectively coupled between the pair of inputs and the pair of outputs, and comprising control terminals respectively coupled to an input of the analog current routing cell.

* * * * *

UNITED STATES PATENT AND TRADEMARK OFFICE
CERTIFICATE OF CORRECTION

PATENT NO. : 7,593,700 B2
APPLICATION NO. : 11/550871
DATED : September 22, 2009
INVENTOR(S) : Cathelin et al.

It is certified that error appears in the above-identified patent and that said Letters Patent is hereby corrected as shown below:

| | |
|---|---|
| Column 5, Line 59 | Delete: "STNE" <br> Insert -- STN. -- |
| Column 6, Line 9 | Delete: "iouit/iin" <br> Insert -- iout/iin -- |
| Column 6, Line 36 | Delete: "supply" <br> Insert -- supply. -- |

Signed and Sealed this

Twenty-fourth Day of August, 2010

David J. Kappos
*Director of the United States Patent and Trademark Office*